United States Patent [19]
Lee

[11] Patent Number: 5,953,212
[45] Date of Patent: Sep. 14, 1999

[54] DEVICE FOR FASTENING HEAT SINK TO CPU

[75] Inventor: Richard Lee, Taipei, Taiwan

[73] Assignee: Hon Hai Precision Ind. Co., Ltd., Taipei Hsien, Taiwan

[21] Appl. No.: 09/115,456

[22] Filed: Jul. 14, 1998

[30] Foreign Application Priority Data

Jul. 15, 1997 [TW] Taiwan ................................. 86212167

[51] Int. Cl.⁶ ....................................................... H05K 7/20
[52] U.S. Cl. ............................ 361/709; 361/704; 361/710; 361/717; 361/718; 257/718; 257/719; 257/727; 174/16.3; 165/80.3; 165/185
[58] Field of Search ................................... 361/704, 709, 361/710, 717, 1, 719, 722; 24/295, 457, 458, 495, 505, 517; 174/16.3; 257/706, 707, 719, 727; 165/80.3, 185; 248/316.7, 505, 510

[56] References Cited

U.S. PATENT DOCUMENTS

| | | | |
|---|---|---|---|
| 5,602,719 | 2/1997 | Kinion | 361/704 |
| 5,638,258 | 6/1997 | Lin | 361/704 |
| 5,671,118 | 9/1997 | Blomquist | 361/704 |
| 5,684,676 | 11/1997 | Lin | 361/704 |
| 5,771,960 | 6/1998 | Lin | 165/80.3 |

*Primary Examiner*—Leo P. Picard
*Assistant Examiner*—Boris L. Chervinsky

[57] ABSTRACT

A heat sink mounting device for closely attaching a heat sink to a CPU which has been mounted to an electrical connector, consists of two mounting ears formed on the electrical connector. A clip has an arced middle portion pressing the heat sink toward the CPU, a first arm vertically extending from an end of the middle portion to fixedly engage with one of the mounting ears, and a second arm defining a handle portion for receiving a pressing force. A flap has an upper end pivotably engaging with the second arm and a lower end fixedly engaging with the other mounting ear.

12 Claims, 3 Drawing Sheets

DEVICE FOR FASTENING HEAT SINK TO CPU

BACKGROUND OF THE INVENTION

1. Field of The Invention

The present invention relates to a device for fixedly mounting a heat sink to a central processing unit (CPU) for dissipating heat generated therefrom.

2. The Prior Art

Since the processing speed of computer CPUs has increased resulting in higher temperatures, heat dissipation of the CPU becomes an increasingly important issue. To solve this problem, a number of devices for mounting heat sinks to CPUs have been proposed as in U.S. Pat. Nos. 4,745,456, 5,019,940 and 5,594,624 and Taiwan Patent Application Nos. 83217100-1, 83217100-2, 84207163, 84212747, 85200861 and 85206293. This prior art discloses a mounting device which can fasten a heat sink, a CPU and a CPU connector together, thereby enabling the heat sink to dissipate heat generated by the CPU. However, the prior art mounting devices have the following disadvantages.

1. The mounting devices disclosed in U.S. Pat. Nos. 4,745,456 and 5,019,940 and Taiwan Patent Application Nos. 83217100-2, 84212747 and 85200861 consist of too many components and have a complicated structure.

2. The prior art devices disclosed in U.S. Pat. No. 5,594,624 and Taiwan Patent Application Nos. 83217100-1, 84207163 and 85206293 each have a simpler structure, however, specially designed tools are required to fasten/detach the heat sinks to/from the CPU. Therefore, the cost of the heat sink mounting devices is increased and assembly thereof is further complicated.

Hence, an improved heat sink mounting device is needed to eliminate the above mentioned defects of current heat sink mounting devices.

SUMMARY OF THE INVENTION

Accordingly, an objective of the present invention is to provide a heat sink mounting device which has a simple structure.

Another objective of the present invention is to provide a heat sink mounting device which can be readily used to fasten/detach the heat sink to/from the CPU with a single hand, without the necessity of using any tool.

To fulfill the above mentioned objectives, according to one embodiment of the present invention, a device for fixedly mounting a heat sink to a CPU mounted to a CPU connector which forms two ears on two opposite sides thereof, consists of a clip and a flap. The clip has an arced middle portion exerting a pressing force on the heat sink toward the CPU and defining opposed first and second ends, a first arm substantially extending vertically downward from the first end of the middle portion to fixedly engage with one of the ears, a second arm substantially extending horizontally from the second end of the middle portion and defining a handle portion and a flap mounting rib between the handle portion and the middle portion. The flap has an upper end pivotably connected to the rib and a lower end fixedly engaging with the other ear.

DETAILED DESCRIPTION OF THE PREFERRED EMBODIMENT

Reference will now be made in detail to the preferred embodiment of the present invention.

Figure 1:
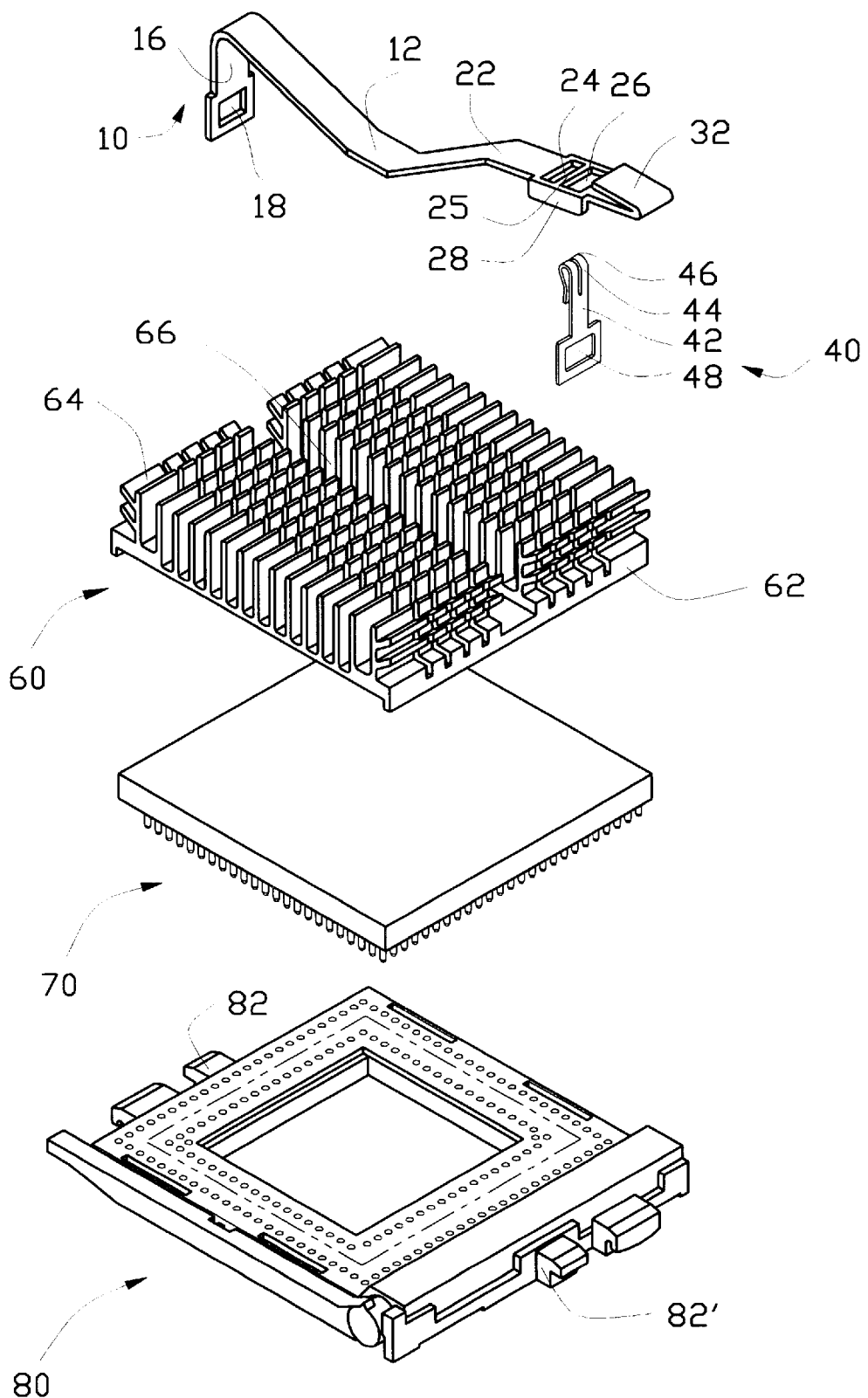
FIG. 1 is a perspective, exploded view of a heat sink mounting device in accordance with the present invention and a heat sink, a CPU and a CPU connector.

Referring to FIG. 1, a heat sink mounting device for fastening a heat sink 60 to a CPU 70 which has been mounted on a CPU connector 80 (in this embodiment, the connector being a ZIF (zero insertion force) connector) includes a clip 10, a flap 40 and first and second mounting ears 82, 82' protruding from two opposite side walls of the connector 80, respectively. The heat sink 60 is formed by aluminum extrusion to have a base plate 62 and a number of heat dissipating fins 64 projecting upwards from the base plate 62. A groove 66 is defined in a middle of the heat sink 60 to divide the heat dissipating fins 64 into two groups.

The clip 10 is formed by stamping a sheet of spring steel to have an elongate configuration. The clip 10 can be generally divided into an arced middle body portion 12, a left arm 16 extending vertically downward from a left end of the body portion 12 and a right arm 22 horizontally extending from a right end of the body portion 12. The left arm 16 defines a first locking hole 18 in an enlarged end thereof. The right arm 22 defines a manipulating handle 32 at an end thereof by bending the end of the right arm 22 toward the body portion 12. A rib 25 is formed in a middle portion of the right arm 22 between a large rectangular hole 26 and a small rectangular hole 24. Two reinforcing tabs 28 (only one shown) are formed extending downward from each side of the right arm 22 adjacent to the rib 25 and the holes 24, 26 to increase the rigidity of the right arm 22.

The flap 40 is formed to have an elongate body 42 with an upper hook portion 44 having a slit 46 defined therein to increase the flexibility of the hook portion 44 and a lower enlarged end defining a second locking hole 48.

Figure 2:
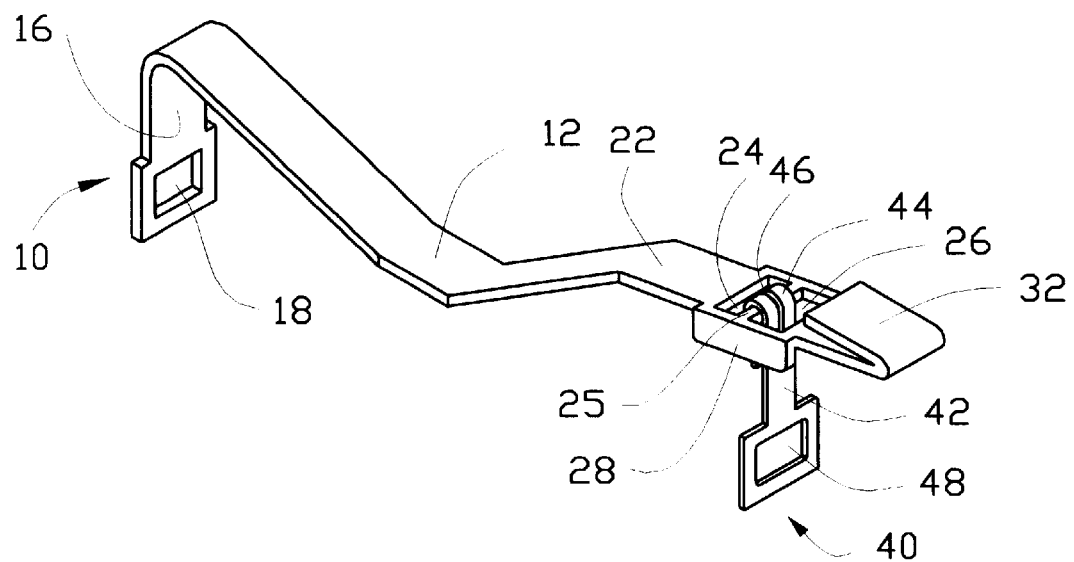
FIG. 2 is a perspective view of the assembled CPU mounting device in accordance with the present invention.

Referring to FIG. 2, the flap 40 is assembled to the right arm 22 of the clip 10 by firstly extending the hook portion 44 upwardly through the large hole 26 and then moving the hook portion 44 downward to cause it to pivotably engage with the rib 25.

Figure 3:
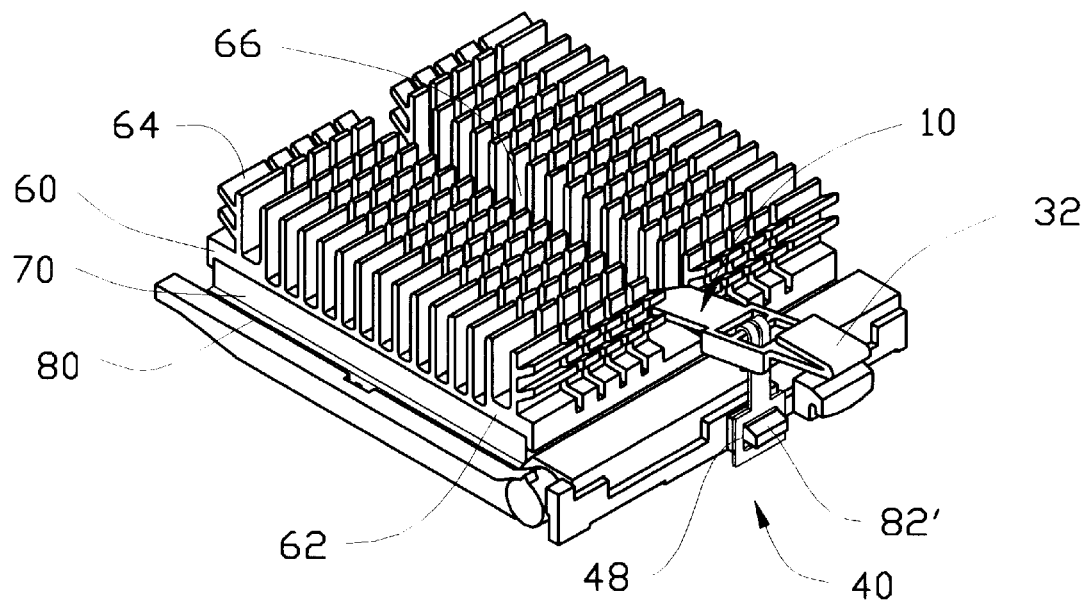
FIG. 3 is an assembled, perspective view of FIG. 1.

To fixedly attach the heat sink 60 to the CPU 70 which has been mounted to the CPU connector 80, referring back to FIG. 1, the heat sink 60 is firstly placed onto the CPU 70. The body portion 12 of the clip 10 is then placed into the groove 66 of the heat sink 60 to reach a position in which the body portion 12 contacts the base plate 62 of the heat sink 60 and the mounting ear 82 is fittingly extended through the first locking hole 18 (not shown). Thereafter, the flap 40 is moved downward toward the second mounting ear 82' by using one finger to press the handle portion 32 to reach a position in which the second mounting ear 82' is in alignment with the second locking hole 48. Meanwhile, the flap 40 is pivoted toward the CPU connector 80 to cause the second mounting ear 82' to extend through the second locking hole 48. Finally, the pressing force acting on the handle portion 32 is released thereby causing the right arm 22 to rebound and the flap 40 to fixedly engage with the second mounting ear 82' by a spring force of the clip 10. In the assembled state as shown in FIG. 3, the spring force of the clip 10 causes the left and right arms 16, 22 to move upward and the body portion to move downward to press the heat sink 60 toward the CPU 70. Therefore, the heat sink 60 is secured between the clip 12 and the CPU 70 to closely engage with the CPU 70. The heat generated by the CPU 70 can thus be effectively absorbed and dissipated by the heat sink 60.

To detach the heat sink 60 from the CPU 70, the handle portion 32 is pressed downward again to release the fixed engagement between the flap 40 and the second mounting ear 82'. The flap 40 is then pivoted away from the second mounting ear 82' and the pressing force acting on the handle portion 32 is released thereby unlocking the engagement between the left arm 16 and the first mounting ear 82, and the flap 40 and the second mounting ear 82'. Therefore, the clip 10 is removable from the heat sink 60 to enable the heat sink 60 to be detached from the CPU 70.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A combination of a heat sink, a CPU, a CPU connector and a heat sink mounting device, comprising:
    a CPU connector;
    a CPU mounted on the connector;
    a heat sink mounted on the CPU; and
    a heat sink mounting device comprising:
        a first mounting ear and a second mounting ear fixed to the CPU connector;
        a clip having an arced middle portion exerting a pressing force on the heat sink toward the CPU and defining opposite first and second ends, a first arm substantially extending vertically downward from the first end of the middle portion to fixedly engage with the first mounting ear, a second arm substantially extending horizontally from the second end of the middle portion and defining a handle portion for receiving a pressing force thereon; and
        a flap having an upper end pivotably connected to the second arm at a location between the middle portion and the handle portion and a lower end fixedly engaging with the second mounting ear;
    wherein the upper end of the flap pivotably connects with a rib formed by the second arm of the clip and wherein a large hole and a small hole are defined in the second arm and are separated by the rib.

2. The combination in accordance with claim 1, wherein the first arm defines a first locking hole in an end thereof, the first mounting ear being fittingly engaged with the first locking hole.

3. The combination in accordance with claim 1, wherein the flap has an upper hook portion pivotably engaging with the rib and a lower end defining a second locking hole, the second mounting ear being fittingly engaged with the second locking hole.

4. The combination in accordance with claim 3, wherein the hook portion of the flap defines a slit therein.

5. The combination in accordance with claim 1 further comprising two reinforcing tabs respectively extending downward from two sides of the second arm adjacent to the rib, and the small and large holes.

6. The combination in accordance with claim 1, wherein each of the large and small holes has a rectangular shape.

7. The combination in accordance with claim 1, wherein the handle portion is formed by bending an end of the second arm toward the middle portion of the clip.

8. The combination in accordance with claim 1, wherein the heat sink has a base plate, a number of heat dissipating fins projecting from the base plate and a groove dividing the fins into two groups, the middle portion of the clip being extended into the groove to press the base plate toward the CPU.

9. The combination in accordance with claim 1, wherein the first mounting ear is opposite the second mounting ear.

10. A heat sink mounting device for closely attaching a heat sink to a CPU which has been mounted on an electrical connector, comprising:
    first and second mounting ears adapted to be fixed to the electrical connector;
    a clip having an arced middle portion adapted for pressing the heat sink toward the CPU, a first arm vertically extending from an end of the middle portion for fixedly engaging with the first mounting ear, a second arm defining a handle portion adapted for receiving a pressing force; and
    a flap having an upper end for pivotably engaging with the second arm and a lower end for fixedly engaging with the second mounting ear;
    wherein the first arm defines a first locking hole in an end thereof for fittingly receiving the first mounting ear, the flap has an upper hook portion for pivotably engaging with a rib formed by the second arm of the clip and a lower end defining a second locking hole for fittingly receiving the second mounting ear, and the second arm defines large and small holes adjacent to sides of the rib, respectively.

11. The heat sink mounting device in accordance with claim 10, wherein the upper hook portion of the flap defines a slit therein to increase the flexibility of the hook portion.

12. The heat sink mounting device in accordance with claim 10, wherein the second arm further comprises two reinforcing tabs respectively extending downward from two sides thereof adjacent to the rib and the large and small holes.

* * * * *